United States Patent
Rodgers et al.

(10) Patent No.: US 6,731,513 B2
(45) Date of Patent: May 4, 2004

(54) SHIELDED MULTI-CONDUCTOR INTERCONNECT BUS FOR MEMS

(75) Inventors: Murray Steven Rodgers, Albuquerque, NM (US); Stephen Matthew Barnes, Albuquerque, NM (US)

(73) Assignee: Memx, Inc., Albuquerque, NM (US)

( * ) Notice: Subject to any disclaimer, the term of this patent is extended or adjusted under 35 U.S.C. 154(b) by 0 days.

(21) Appl. No.: 10/099,724

(22) Filed: Mar. 15, 2002

(65) Prior Publication Data

US 2003/0173654 A1 Sep. 18, 2003

(51) Int. Cl.[7] .............. H05K 7/02; H05K 7/06; H05K 7/08; H05K 7/10
(52) U.S. Cl. ............ 361/777; 361/803; 361/818; 174/35 R; 257/659
(58) Field of Search ................ 361/775–778, 361/816, 818, 789–790; 174/35 R, 35 C, 52.1, 250–260; 257/659–661, 208–211; 333/12, 35

(56) References Cited

U.S. PATENT DOCUMENTS

| 5,151,770 A | * | 9/1992 | Inoue | 257/660 |
|---|---|---|---|---|
| 5,357,138 A | * | 10/1994 | Kobayashi | 257/664 |
| 5,369,219 A | * | 11/1994 | Kerns | 174/250 |
| 5,783,340 A | | 7/1998 | Farino et al. | 430/22 |
| 5,798,283 A | | 8/1998 | Montague et al. | 438/24 |
| 5,804,084 A | | 9/1998 | Nasby et al. | 216/2 |
| 5,880,024 A | * | 3/1999 | Nakajima et al. | 438/669 |
| 5,910,684 A | * | 6/1999 | Sandhu et al. | 257/758 |
| 5,919,548 A | | 7/1999 | Barron et al. | 428/138 |
| 5,963,788 A | | 10/1999 | Barron et al. | 438/48 |
| 6,020,272 A | | 2/2000 | Fleming | 438/734 |
| 6,022,787 A | * | 2/2000 | Ma | 438/422 |
| 6,082,208 A | | 7/2000 | Rodgers et al. | 74/406 |
| 6,307,252 B1 | * | 10/2001 | Knoedl, Jr. | 257/659 |

* cited by examiner

*Primary Examiner*—David A. Zarneke
*Assistant Examiner*—Tuan Dinh
(74) *Attorney, Agent, or Firm*—Marsh Fischmann & Breyfogle LLP

(57) ABSTRACT

A shielded multi-conductor interconnect bus for use in interconnecting MEM devices with control signal sources or the like and a method of fabricating a shielded multi-conductor interconnect bus are disclosed. In one embodiment, a shielded interconnect bus formed on a substrate (20) includes a plurality of electrically conductive lines (42) arranged in sets of one, two or more conductive lines between electrically conductive shield walls (46, 66). The electrically conductive lines (42) are surrounded by layers of dielectric material (30, 50). An electrically conductive shield (78) overlies the electrically conductive lines (42) and electrically conductive shield walls (46, 66).

36 Claims, 16 Drawing Sheets

SHIELDED MULTI-CONDUCTOR INTERCONNECT BUS FOR MEMS

FIELD OF THE INVENTION

The present invention relates generally to microelectromechanical systems (MEMS), and more particularly to the design and fabrication of interconnect architectures for MEMS.

BACKGROUND OF THE INVENTION

MEMS can include numerous electromechanical devices fabricated on a single substrate, many of which are to be separately actuated in order to achieve a desired operation. For example, a MEMS optical switch may include numerous mirrors that are each positionable in a desired orientation for reflecting optical signals between originating and target locations upon actuation of one or more microactuators associated with each mirror. In order for each mirror to be separately positioned, separate control signals need to be supplied to the microactuators associated with each mirror. One manner of accomplishing this is to connect each microactuator to a control signal source with a separate electrical conductor (i.e., an interconnect line) fabricated on the surface of the substrate that extends between its associated microactuator and a bond pad at the periphery of the substrate where it can be easily connected to an off-chip control signal source. In this regard, the separate interconnect lines together comprise an interconnect bus and are typically arranged to run parallel with each other for substantial portions of their length.

As may be appreciated, the amount of footprint required on the surface of the substrate for an interconnect bus is an important factor in designing MEMS since increasing the footprint of the interconnect bus decreases the amount of footprint available for desired devices (e.g., mirrors and actuators). Another consideration is possible cross-talk between the separate interconnect lines. Cross-talk is a problem because a control signal intended for one actuator can be coupled from its interconnect line into adjacent interconnect lines causing undesired actuation of other actuators. A further consideration is the possibility of shorting between adjacent interconnect lines. Where the interconnect bus lines are exposed on the surface of the substrate, particles and the like can settle across adjacent interconnect lines thereby causing short circuits effecting operation of the MEMS.

SUMMARY OF THE INVENTION

Accordingly, the present invention provides a shielded multi-conductor interconnect bus for MEMS and a method for fabricating such an interconnect bus. The shielded multi-conductor interconnect bus of the present invention substantially reduces the possibility of cross-talk between adjacent interconnect lines, alleviates the possibility of short circuits due to particles and the like settling across adjacent interconnect lines, and optimizes the amount of footprint required for such an interconnect bus.

According to one aspect of the present invention, a shielded multi-conductor interconnect bus includes a substrate. The substrate may, for example, be comprised of silicon. A first dielectric layer overlies and is supported by at least a portion of the substrate. In this regard, the first dielectric layer may, for example, be the lowest layer of material on the substrate (i.e., it may be formed directly on the upper surface of the substrate without any intervening layers). In one embodiment, the substrate is comprised of silicon and the first dielectric layer comprises a dielectric stack deposited directly on the upper surface of the substrate that includes a lower thermal oxide layer and an upper silicon nitride layer. A plurality of substantially parallel electrically conductive lines are formed on the first dielectric layer. In this regard, the electrically conductive lines may be formed from a first layer of doped polysilicon.

The interconnect bus also includes a plurality of substantially parallel electrically conductive walls formed on the first dielectric layer. Although desirable, it should be understood that electrically conductive walls described herein do not have to be continuous along their lengthwise extent and may, in fact, have one or more breaks formed therein as desired. Each electrically conductive wall includes an upper section that extends vertically above the level of the electrically conductive lines. There may also be a plurality of substantially parallel channels formed in the first dielectric layer with lower sections of the electrically conductive walls being formed in the channels. In this regard, the lower sections of the electrically conductive walls may be formed from the first layer of doped polysilicon and the upper sections of the electrically conductive walls may be formed from a second layer of doped polysilicon. The second layer of doped polysilicon may be comprised of a thinner lower layer of doped polysilicon and a thicker upper layer of doped polysilicon. Where the first dielectric layer is the lowest layer of material on the substrate, each channel preferably extends vertically downward through the entire thickness of the first dielectric layer to expose the upper surface of the substrate along at least a portion of each channel, and, more preferably, along the entire length of each channel.

The electrically conductive lines and electrically conductive walls are arranged in pattern such that an electrically conductive wall is located between adjacent sets of the electrically conductive lines. In this regard, each set of electrically conductive lines includes at least one of the electrically conductive lines, and may include two or more electrically conductive lines.

In addition to separating adjacent sets of electrically conductive lines, the electrically conductive walls also contact the underside of an electrically conductive shield positioned in a spaced relation above the electrically conductive lines. The electrically conductive shield may be formed from the second layer of doped polysilicon. In one embodiment, there is a second dielectric layer beneath the electrically conductive shield overlying the electrically conductive lines and the first dielectric layer. The second dielectric layer may be comprised of a sacrificial material (e.g., silicon dioxide or silicate glass). The second dielectric layer includes a plurality of channels formed therein permitting the upper sections of the electrically conductive walls to extend vertically upward therethrough to contact the underside of the electrically conductive shield. Thus, each electrically conductive line is surrounded by dielectric material, and each set of electrically conductive lines is electrically isolated from the other sets of electrically conductive lines within, what is in effect, an equipotential tube comprising the substrate on the bottom, the electrically conductive walls on either side and the electrically conductive shield on the top.

It should be noted that a shielded multi-conductor interconnect bus in accordance with the present invention may be fabricated on a substrate that has one or more intervening layers of electrically conductive material and/or dielectric material between the upper surface of the substrate and the first layer of dielectric material. In this regard, the channels in the first dielectric layer extend vertically down into the first dielectric layer to expose the upper surface of an intervening layer of electrically conductive material, and the intervening layer of electrically conductive material, rather than the substrate, serves as the bottom of the equipotential tube.

According to another aspect of the present invention, a method for making a shielded multi-conductor interconnect bus begins with the step of removing portions of a first layer of dielectric material (e.g., a dielectric stack comprising a lower thermal oxide layer and an upper silicon nitride layer) overlying and supported by at least a portion of a substrate (e.g., a silicon substrate) to provide a plurality of substantially parallel channels in the first layer of dielectric material. In this regard, the first dielectric layer may be the lowest layer of material deposited on the substrate and sufficient material may be removed so that the channels in the first layer of dielectric material extend vertically downward through the first layer of dielectric material to preferably expose the upper surface of the substrate along at least a portion of each channel, and, more preferably, along the entire length of each channel. A first layer of electrically conductive material (e.g., doped polysilicon) is then deposited over the first layer of dielectric material, with the first layer of electrically conductive material filling the channels formed in the first layer of dielectric material. Strips of the first layer of electrically conductive material are then removed to expose an upper surface of the first layer of dielectric material at the bottom of each strip. Removal of the strips provides a plurality of electrically conductive lines on the first layer of dielectric material that typically extend substantially parallel with the channels formed in the first layer of dielectric material. In this regard, the material may be removed from the first dielectric layer and the first electrically conductive layer, respectively, in a pattern wherein one of the channels defined thereby is located between sets of the electrically conductive lines defined thereby, with each set of electrically conductive lines including at least one electrically conductive line.

After the electrically conductive lines are formed, a second layer of dielectric material is then deposited over the first layer of electrically conductive material (e.g., a sacrificial material such as silicon dioxide or silicate glass), with the second layer of dielectric material filling in the strips removed from the first layer of electrically conductive material. Portions of the second layer of dielectric material are removed therefrom to provide a plurality of substantially parallel channels in the second layer of dielectric material. The channels in the second layer of dielectric material are located to overlie the filled channels in the first layer of dielectric material, and the channels extend downward through the second layer of dielectric material to expose the first layer of electrically conductive material filling the channels in the first layer of dielectric material. A second layer of electrically conductive material (e.g. doped polysilicon) is then deposited in the channels formed in the second layer of dielectric material and over the remaining portions of the second dielectric layer. In some fabrication processes, the second layer of electrically conductive material may actually be comprised of two layers of doped polysilicon deposited in several in steps. For example, a thin lower layer of doped polysilicon may be deposited, a layer of sacrificial material may be deposited, the sacrificial material may be removed, and a thicker upper layer of doped polysilicon may then be deposited.

According to a further aspect of the present invention, a shielded multi-conductor interconnect bus includes a substrate. A plurality of electrically conductive lines are formed on the substrate, with each electrically conductive line being surrounded by dielectric material along a lengthwise extent of each electrically conductive line. An electrically conductive shield overlies and is positioned in a spaced relation above the electrically conductive lines. A plurality of electrically conductive walls are also formed on the substrate, with each electrically conductive wall being in contact along a lower section thereof with the substrate and along an upper section thereof with the electrically conductive shield. The electrically conductive lines and electrically conductive walls are arranged in pattern wherein one of the electrically conductive walls is located between sets of the electrically conductive lines, with each set of electrically conductive lines including at least one electrically conductive line. In one embodiment, the substrate is a silicon substrate covered with a dielectric stack (e.g., a lower thermal oxide layer and an upper silicon nitride layer), the electrically conductive lines, walls and shield are comprised of doped polysilicon, and the electrically conductive lines are covered with a sacrificial material (e.g., silicon dioxide or silicate glass).

According to one more aspect of the present invention, a shielded electrically conductive line includes a substrate and a first dielectric layer overlying and supported by at least a portion of the substrate. In this regard, the first dielectric layer may, for example, be the lowest layer of material on the substrate. In one embodiment, the first dielectric layer is comprised of silicon and the first dielectric layer comprises a dielectric stack deposited directly on an upper surface of the substrate. There is one electrically conductive line formed on the first dielectric layer, which may be formed from a first layer of doped polysilicon. A pair of parallel electrically conductive walls are also formed on the first dielectric layer with each electrically conductive wall being located on an opposing side of the electrically conductive line. Each electrically conductive wall includes an upper section extending above the level of the electrically conductive line. There may also be a pair of channels formed in the first dielectric layer, with lower sections of the electrically conductive walls formed in the channels. In this regard, the lower sections of the electrically conductive walls may also be formed from the first layer of doped polysilicon, and the upper sections of the electrically conductive walls may be formed from a second layer of doped polysilicon, which may itself be comprised of a thinner lower layer of doped polysilicon and a thicker upper layer of doped polysilicon. An electrically conductive shield formed, for example, from the second electrically conductive layer is positioned in a spaced relation above the electrically conductive line in contact with the upper sections of the electrically conductive walls. The shielded electrically conductive line may be an individual line extending, for example, between a bond pad and a MEM device, or the shielded electrically conductive line may also comprise a transversely oriented electrically conductive line extending from a shielded interconnect bus to connect a line of the shielded interconnect bus with, for example, a desired MEM device.

These and other aspects and advantages of the present invention will be apparent upon review of the following Detailed Description when taken in conjunction with the accompanying figures.

DESCRIPTION OF THE DRAWINGS

For a more complete understanding of the present invention and further advantages thereof, reference is now made to the following Detailed Description, taken in conjunction with the drawings, in which.

DETAILED DESCRIPTION

Referring to FIGS. 1A–E and FIGS. 2A–B, there are shown cross-sectional and top views, respectively, illustrating the microfabrication process of a portion of one embodiment of a shielded multi-conductor interconnect bus 10. The microfabrication process begins with a substrate 20 having a first dielectric layer 30 formed thereon. In this regard, the substrate 20 may be comprised of silicon, and the first dielectric layer 30 may be comprised of a lower layer 30A of thermal oxide (e.g., typically about 630 nanometers thick) formed by a wet oxidation process at an elevated temperature (e.g., 1050° C. for about 1.5 hours) and an upper layer 30B of silicon nitride (e.g., typically about 800 nanometers thick) deposited over the thermal oxide layer using a low-pressure chemical vapor deposition (LPCVD) process at a temperature of about 850° C.

Figure 1A:
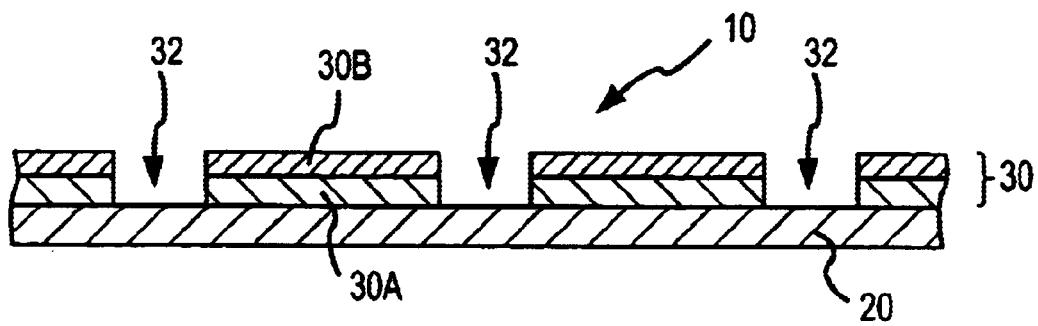
FIGS. 1A–E are cross-sectional views illustrating the microfabrication process of a portion of one embodiment of a shielded multi-conductor interconnect bus in accordance with the present invention.
Figure 2A:
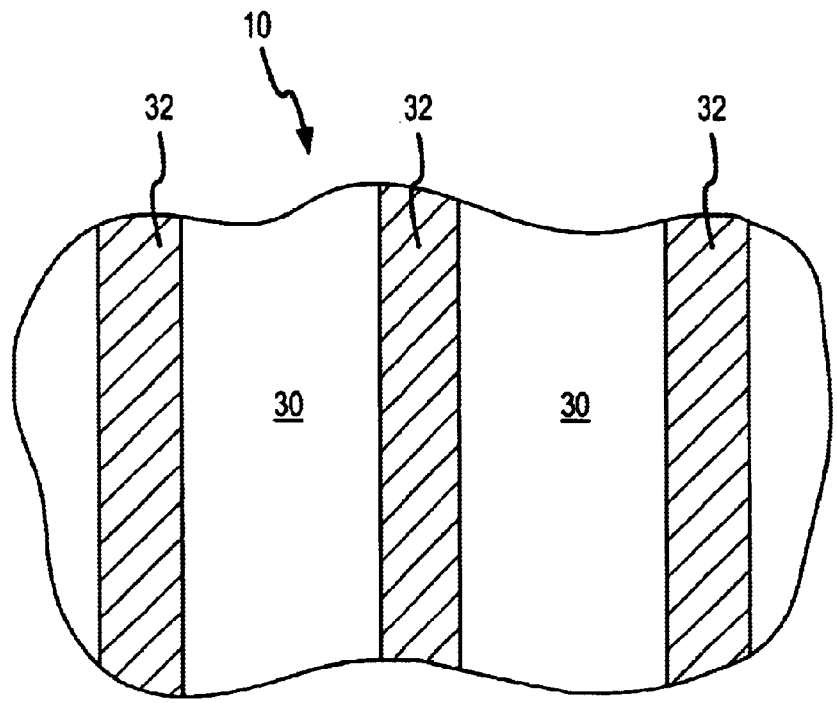
FIGS. 2A–B are top views illustrating the microfabrication process of a portion of the shielded multi-conductor interconnect bus shown in FIGS. 1A–E.

A plurality of substantially parallel channels 32 are formed in the first dielectric layer 30. The channels 32, as with other features of the shielded multi-conductor interconnect bus 10 wherein material is removed from one or more layers of material, may be formed, for example, by a mask and etch removal process employing appropriate masking agents and etchants depending upon the material that is to be removed. Each channel 32 preferably extends vertically down through the first dielectric layer 30 to expose the upper surface of the substrate 20 in one or more locations along the length of the channel 32, and more preferably, along the entire length of the channel 32. FIG. 1A shows a cross-sectional view and FIG. 2A shows a top view after the channels 32 have been formed in the first dielectric layer 30.

After the channels 32 in the first dielectric layer 30 are formed, a first layer of an electrically conductive material (the first electrically conductive layer 40) is deposited over the remaining portions of the first dielectric layer 30 and in the channels 32. The first electrically conductive layer 40 is comprised of an electrically conductive material such as, for example, polycrystalline silicon (also termed polysilicon). In this regard, the first electrically conductive layer 40 is also referred to herein as the Poly0 layer 40. The Poly0 layer is typically about 300 nanometers thick with subsequent polysilicon layers being thicker (e.g., typically between about 1.0 and 2.5 microns thick). The Poly0 layer 40 (and other polysilicon layers described hereafter) may be deposited using a LPCVD process at a temperature of about 580° C. In depositing the Poly0 layer (and other polysilicon layers described hereafter), various dopant materials (e.g., phosphorous) can be employed to make the polysilicon electrically conductive.

Figure 1B:
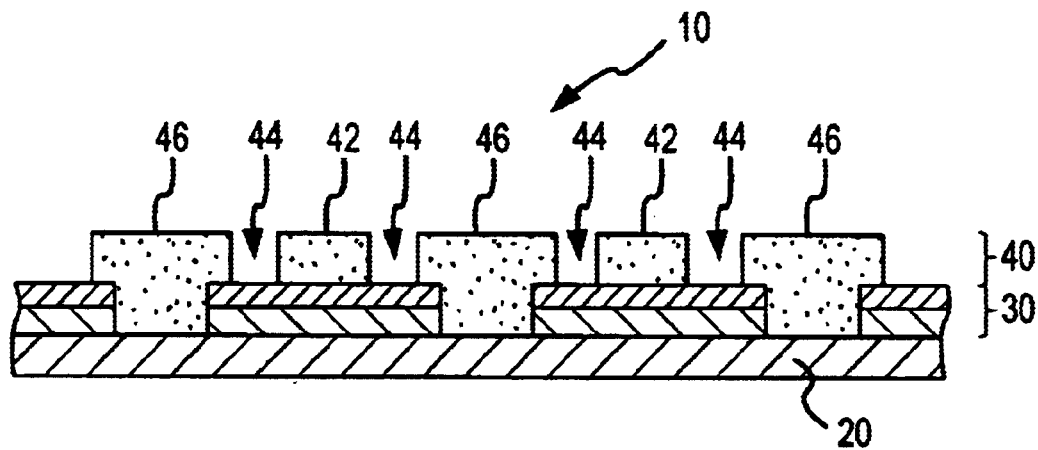
Figure 1C:
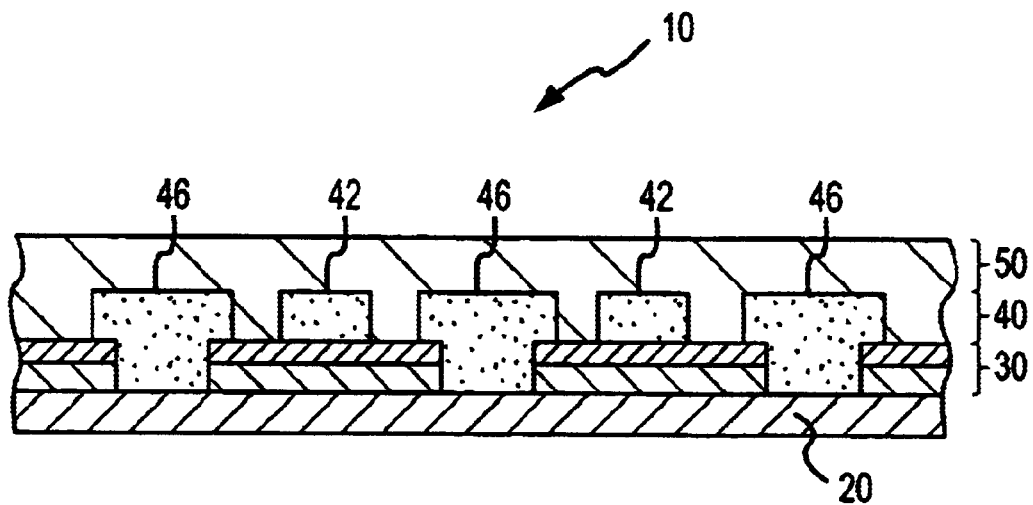
Figure 2B:
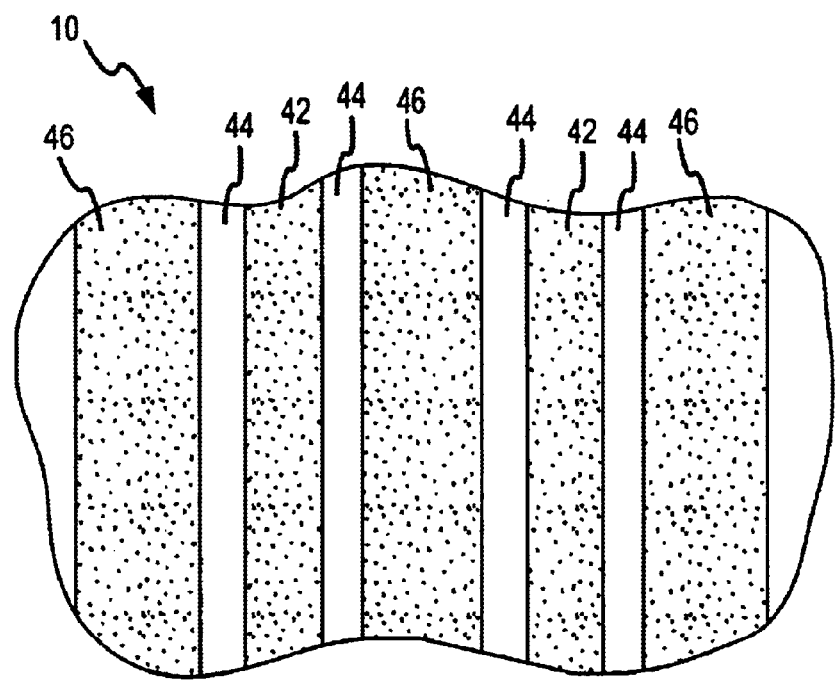

After the Poly0 layer 40 is deposited, a plurality of parallel Poly0 conductive lines 42 are formed between the filled channels 32 in the first dielectric layer 30 by removing strips 44 from the Poly0 layer 40 on both sides of each channel 32 in the first dielectric layer 30. The Poly0 conductive lines 42 are electrically isolated from the substrate 20 along their entire length by the first dielectric layer 30 underneath the Poly0 conductive lines 42. The Poly0 material remaining in and above the filled channels 32 forms Poly0 shield walls 46 between each of the Poly0 conductive lines 42. The strips 44 removed from the Poly0 layer 40 extend down to the first dielectric layer 30 along their entire length in order to electrically isolate the Poly0 conductive lines 42 from the Poly0 shield walls 46. The strips 44 may be located at a small distance from the sides of each channel 32 in the first dielectric layer 30 so that the Poly0 shield walls 46 overlap the first dielectric layer 30 by a small amount on either side of each channel 32. This small overlap allows for alignment tolerance during the fabrication process and ensures that the Poly0 shield wall 46 completely seals and protects the lower oxide layer 30A. FIG. 1B shows a cross-sectional view and FIG. 2B shows a top view after the strips 44 have been removed from the Poly0 layer 40 in order to form the Poly0 conductive lines 42 and Poly0 shield walls 46.

Figure 1D:
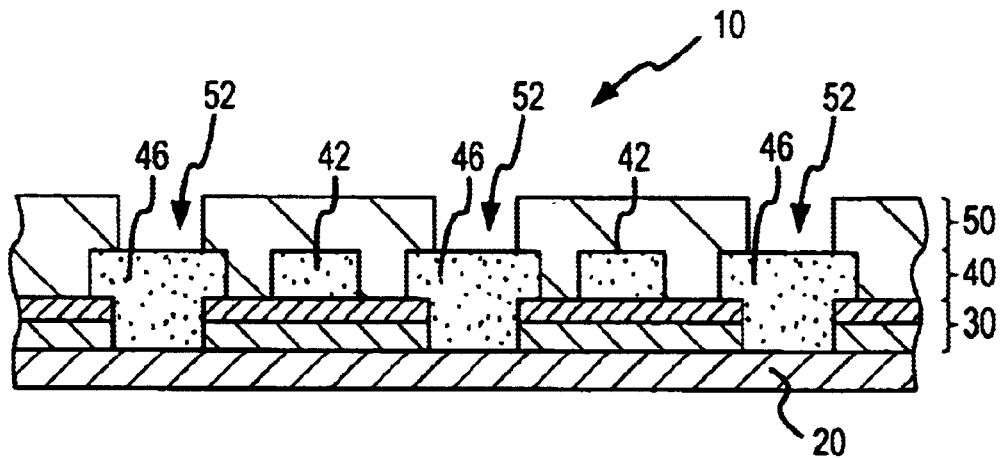
Figure 1E:
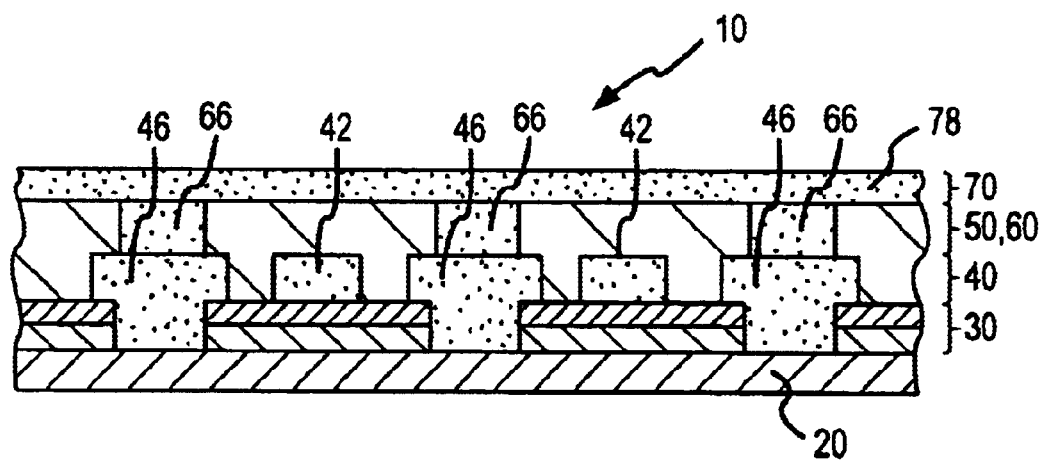

After the Poly0 conductive lines 42 and Poly0 shield walls 46 are formed in the Poly0 layer 40, a second dielectric layer 50 is deposited over the Poly0 layer 40. The second dielectric layer 50 is comprised of an electrically insulating material such as, for example, a sacrificial material (e.g., silicon dioxide or silicate glass). In this regard, the second dielectric layer 50 is also referred to herein as the Sacox1 layer 50. The Sacox1 layer 50 (and other sacrificial layers described herein) may be deposited using a LPCVD process at a temperature of about 580° C. The Sacox1 layer 50 (and subsequent sacrificial layers) is typically about 2.0 microns thick. The Sacox1 layer 50 fills in the strips 44 removed from the Poly0 layer 40. A plurality of channels 52 are then formed in the Sacox1 layer 50. Each of the channels 52 in the Sacox1 layer 50 is located and oriented to coincide with a corresponding one of the channels 32 in the first dielectric layer 30 and extends down through the Sacox1 layer 50 to expose the upper surface of the Poly0 shield 46 formed in its corresponding channel 32 in the first dielectric layer 30. The upper surface of each Poly0 shield wall 46 is exposed by the channel 52 in the Sacox1 layer 50 in one or more locations along its length, and preferably is exposed along the entire length of the Poly0 shield wall 46. FIG. 1D shows a cross-sectional view after the channels 52 have been formed in the Sacox1 layer 50 to expose the upper surfaces of the Poly0 shield walls 46.

After the channels 52 are formed in the Sacox1 layer 50, a second layer of electrically conductive material (the second electrically conductive layer 60) is deposited. The second electrically conductive layer 60 is comprised of an electrically conductive material such as, for example, doped polysilicon. In this regard, the second electrically conductive layer 60 is also referred to herein as the Poly1 layer 60. The Poly1 layer 60 fills the bottom and sidewalls of the channels 52 in the Sacox1 layer 50 and covers the remaining portions of the Sacox1 layer 50.

A third layer of electrically conductive material (the third electrically conductive layer 70) is then deposited over the Poly1 layer 60. The third electrically conductive layer 70 is comprised of an electrically conductive material such as, for example, doped polysilicon. In this regard, the third electrically conductive layer 70 is also referred to herein as the Poly2 layer 70. Prior to depositing the Poly2 layer 70 over the Poly1 layer 60, a third dielectric layer (not shown) of sacrificial material may have been deposited over the Poly1 layer 60 and removed from the regions of the Poly1 layer 60 of interest to the structures described herein. The third dielectric layer (the Sacox2 layer) may be utilized in maintaining desired separation between the Poly1 and Poly2 layers 60, 70 in other microelectromechanical structures, but such separation is not desired herein. In this regard, the Poly1 and Poly2 layers 60, 70 may be considered to be a single layer of polysilicon material. The Poly2 layer 70 fills in the remainder of the channels 52 made in the Sacox1 layer 50 to form, together with the Poly1 layer 60, Poly1/Poly2 shield walls 66 on top of the Poly0 shield walls 46 and a horizontal Poly1/Poly2 shield 78 over the Poly0 conductive lines 42.

The Poly1/Poly2 shield 78 is electrically connected to the substrate 20 by the Poly0 and Poly1/Poly2 shield walls 46, 66 formed in the channels 32, 52 in first dielectric layer 30 and the Sacox1 layer 50 on either side of each Poly0 conductive line 42. Thus, each Poly0 conductive line 42 is, in effect, surrounded along its lengthwise extent by dielectric material that is in turn encased in an equipotential, electrically conductive tube thereby keeping the various Poly0 conductive lines 42 electrically isolated from one another. Additionally, the Poly1/Poly2 shield 78 also prevents shorting between Poly0 conductive lines 42 by preventing particles or the like from contacting adjacent Poly0 conductive lines 42, as might happen in interconnect buses where the conductive lines are exposed along their lengthwise extent.

It should be noted that in the figures described herein, the various polysilicon and sacrificial layers and structures shown are idealized representations of the actual layers and structures that are formed in the various processing steps. In this regard, the corners of various structures (e.g., the channels 32, 52 and strips 44) may be somewhat rounded as opposed to square as is depicted, and layers of material overlying the channels 32, 52 and strips 44 may, for example, have depressions coinciding with the locations of the channels 32, 52 and strips 44 instead of being perfectly level across the channels 32. The size of the depressions and other defects, if any, may be reduced through the use of intermediate chemical mechanical polishing steps to planarize the various layers of polysilicon and sacrificial material after they are deposited.

Multiple Conductors

Figure 3A:
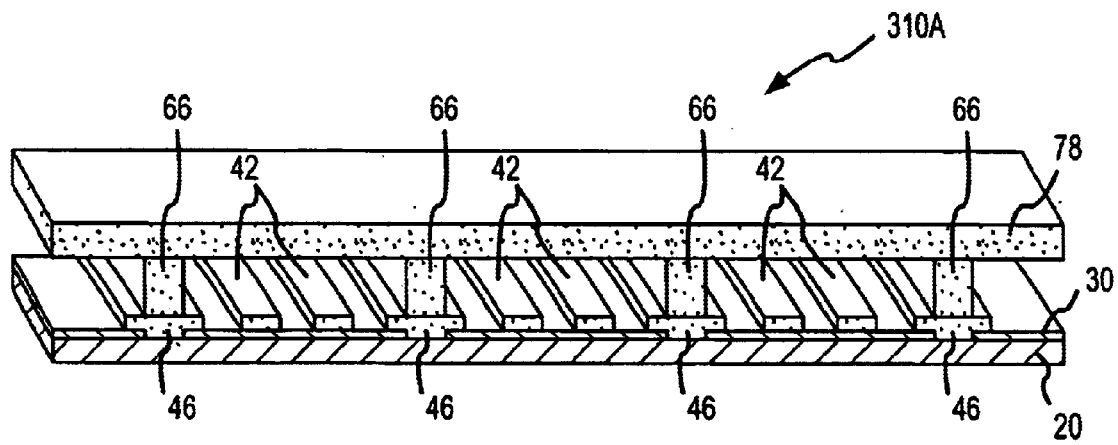
FIGS. 3A–B are perspective cross-sectional views of portions of two embodiments of a shielded multi-conductor interconnect bus in accordance with the present invention having enhanced conductive line density.
Figure 3B:
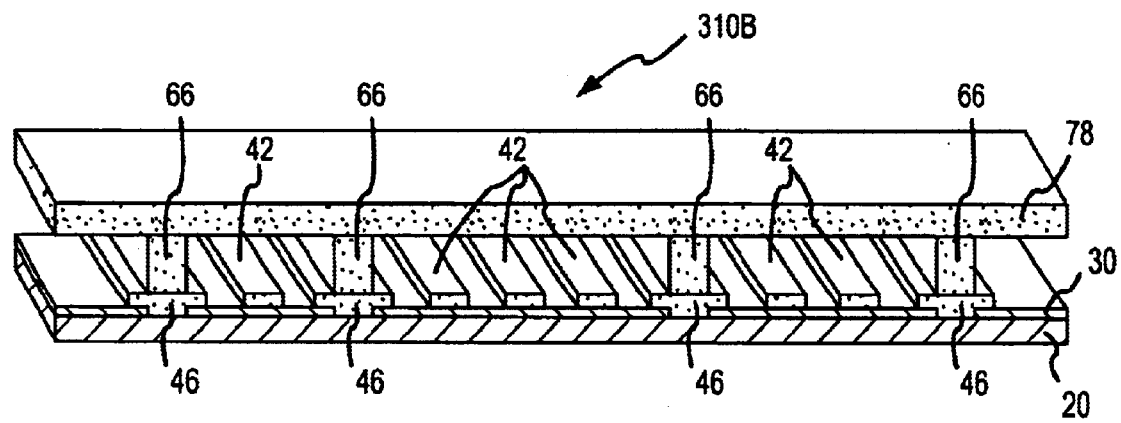

Referring now to FIGS. 3A–B, it is possible to increase the density of the shielded multi-conductor interconnect bus 10 while maintaining the same width Poly0 conductive lines 42 and Poly0 and Poly1/Poly2 shield walls 46, 66. Enhanced Poly0 conductive line 42 density is desirable in order to reduce the amount of footprint required for the interconnect bus and thus increase the amount of footprint available for the fabrication of MEM devices on substrate 20. When the possibility of cross-talk between some of the Poly0 conductive lines 42 is not a significant concern, enhanced density may be achieved by grouping sets of Poly0 conductive lines 42 together between Poly0 and Poly1/Poly2 shield walls 46, 66. FIG. 3A shows a cross-sectional view of a portion of a second embodiment of a shielded multi-conductor interconnect bus 310A wherein the Poly0 conductive lines 42 are grouped into sets having two conductive lines 42 in each set. The Poly0 and Poly1/Poly2 shield walls 46, 66 are located between the sets of Poly0 conductive lines 42 to reduce or eliminate possible cross-talk between the sets of conductive lines 42. Such a shielded multi-conductor interconnect bus 310A is particularly suited for feeding control signals to MEM mirror positioning systems having two MEM actuators for each positionable mirror because cross-talk between the pair of Poly0 conductive lines 42 interconnecting the pair of actuators associated with each mirror may be of limited concern. It should be noted that in other embodiments, each set of Poly0 conductive lines 42 need not have the same number of Poly0 conductive lines 42. For example, as is illustrated in the cross-sectional view of FIG. 3B, some sets of Poly0 conductive lines 42 may have only one Poly0 conductive line 42, other sets may have two Poly0 conductive lines 42, and other sets may have three or more Poly0 conductive lines 42.

In the previously described embodiments of the shielded multi-conductor interconnect bus 10, 310A–B, it has been assumed that the Sacox1 layer 50 remains over the Poly0 conductive lines 42. In some cases, the Sacox1 layer 50 may be removed in part or in its entirety (e.g., during subsequent etching of additional layers). In such situations, the possibility that the Poly1/Poly2 shield 78 might come into contact with the Poly0 conductive lines 42 due to electrostatic attractive forces or capillary forces resulting from wet chemical processing pulling the Poly1/Poly2 shield 78 downward thereby causing a short circuit situation needs to be considered. One manner of alleviating this possibility is to limit the lateral spacing between the Poly0 and Poly1/Poly2 shield walls 46, 66 that support the Poly1/Poly2 shield 78 above the Poly0 conductive lines 42. The required lateral spacing depends upon a number of factors, including the flexibility of the Poly1/Poly2 shield 78 and the anticipated voltage difference(s) between the Poly1/Poly2 shield 78 and the Poly0 conductive lines 42. In this regard, the Poly0 and Poly1/Poly2 shield walls 46, 66 are preferably laterally spaced no more than 10 to 20 microns apart, although several times this distance (e.g., 50 microns) is possible under the right conditions. This assumes that the Poly1/

Poly2 shield is approximately 2.5 microns thick and the anticipated voltage difference between the Poly0 conductive lines and the Poly1/Poly2 shield is less than 300V.

Figure 3C:
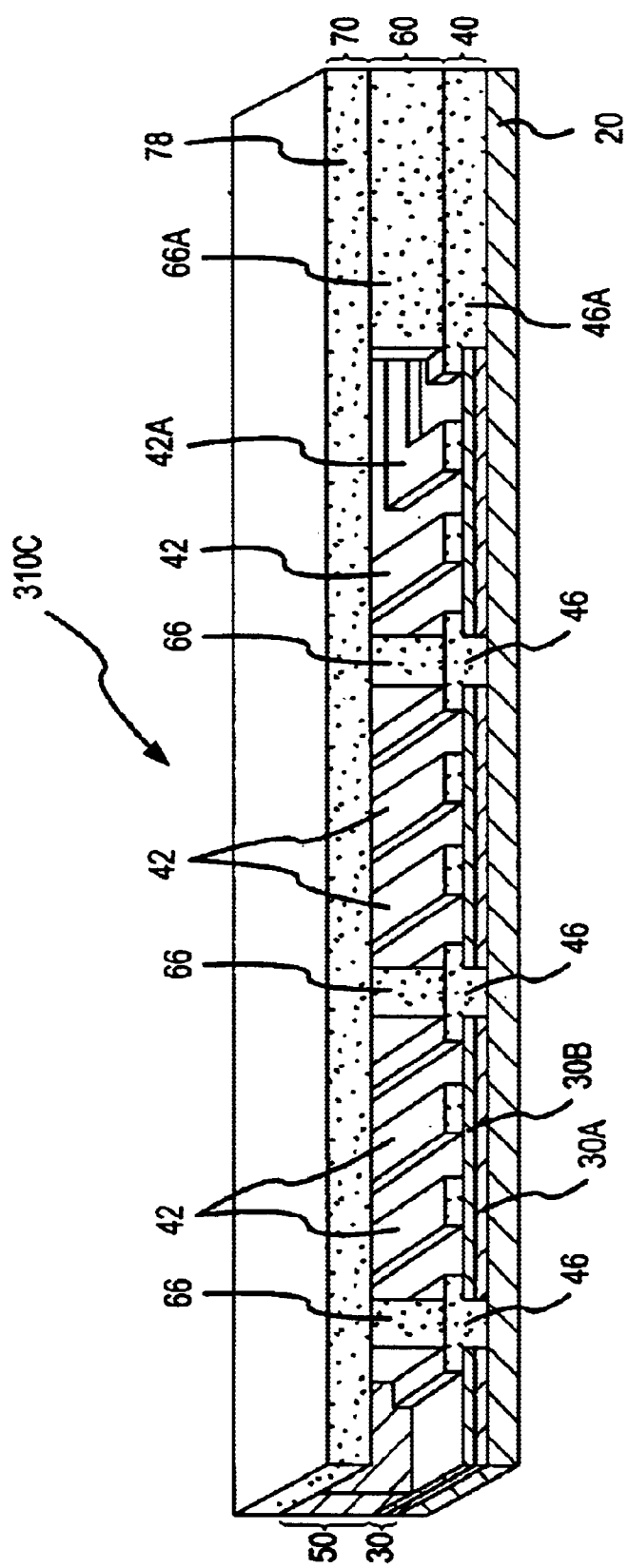
FIG. 3C is a perspective cross-sectional view of a portion of an embodiment of a shielded multi-conductor interconnect bus in accordance with the present invention having a single shielded electrically conductive line breaking out from the bus.
Figure 3D:
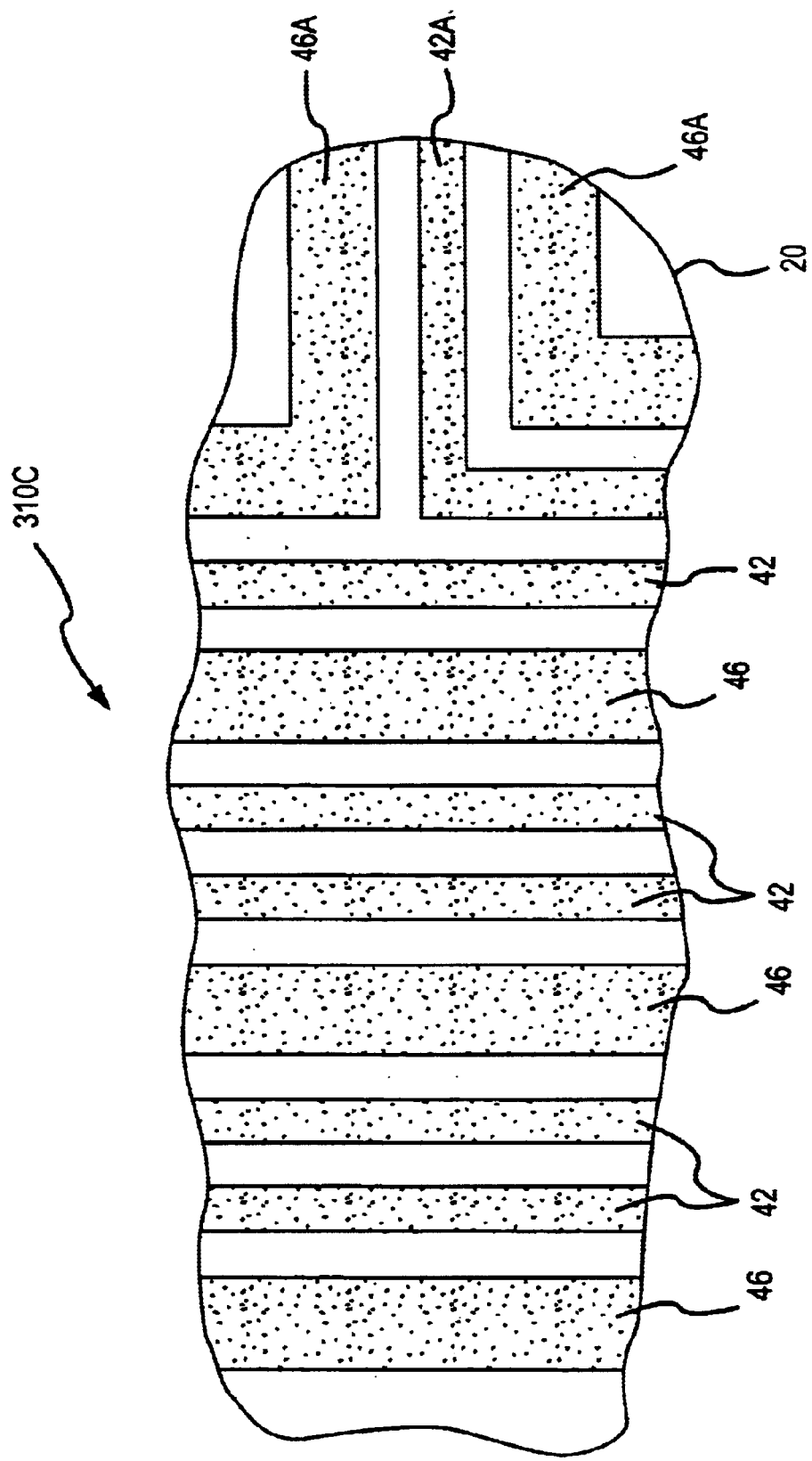
FIG. 3D is a top cross-sectional view of the portion of the shielded multi-conductor interconnect bus having a single shielded electrically conductive line breaking out from the bus.
Figure 3E:
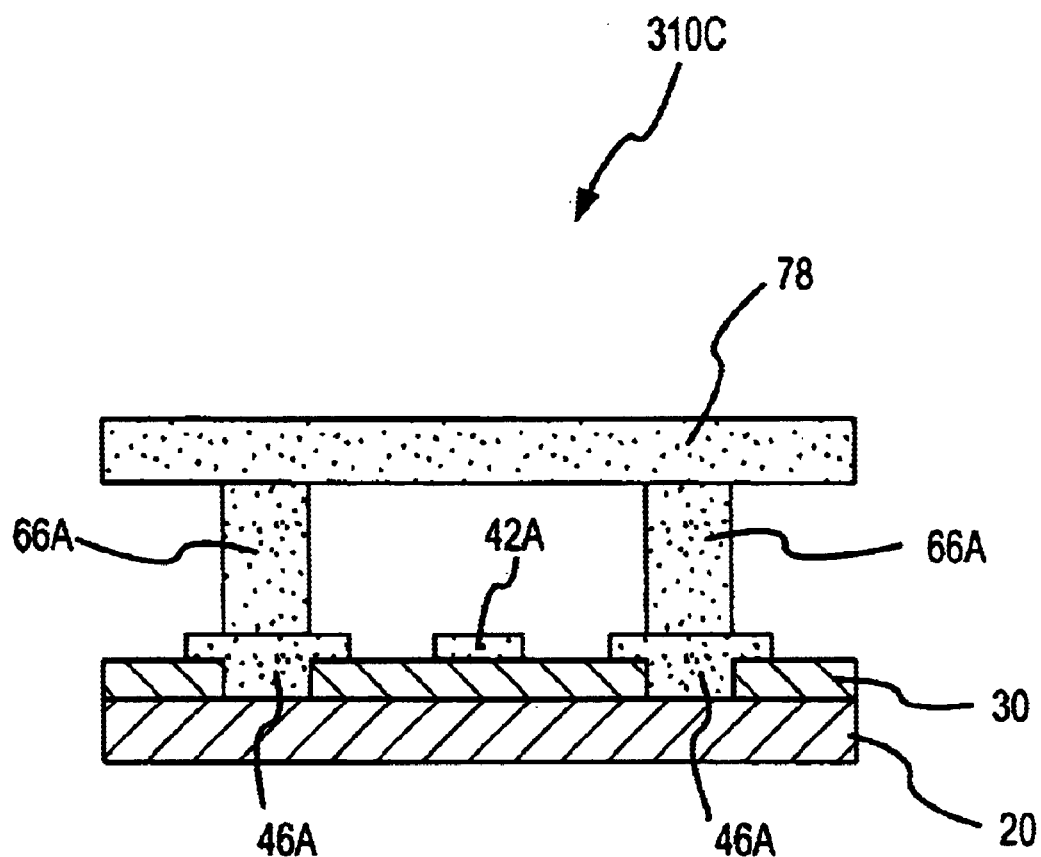
FIG. 3E is a cross-sectional view of the single shielded electrically conductive line.

Referring now to FIGS. 3C–D, there is shown a portion of an embodiment of a shielded multi-conductor interconnect bus 310C having multiple Poly0 conductive lines 42 grouped into sets between the Poly0 and Poly1/Poly2 shield walls 46, 66, with one of the Poly0 conductive lines 42 breaking away from the bus 310C. In this regard, outer Poly0 conductive line 42A may, for example, be broken away from the bus 310C to connect it to a bond pad, MEM actuator, or other MEM structure to which Poly0 conductive line 42A feeds electrical signals. FIG. 3E shows a cross-sectional view of the single shielded Poly0 conductive line 42A that is broken out of the bus 310C.

In order to allow Poly0 conductive line 42A to break transversely away from the bus 310C, there is a break formed in the outer Poly0 and Poly1/Poly2 shield walls 46A, 66A. To maintain the shielding around the transversely oriented Poly0 conductive line 42A, the outer Poly0 and Poly1/Poly2 shield walls 46A, 66A are continued alongside Poly0 conductive line 42A. The Poly1/Poly2 shield 78 is likewise continued over the Poly0 conductive line 42A, supported in a spaced relation above the Poly0 conductive line 42A by the Poly0 and Poly1/Poly2 shield walls 46, 66. It will be appreciated that conductive lines may break away from any of the shielded interconnect buses described herein in a similar manner. Further, it will be appreciated that multiple conductive lines may break away from a shielded interconnect bus, either individually or as a group between one pair of conductive shield walls.

Multiple Level Interconnects

Figure 4A:
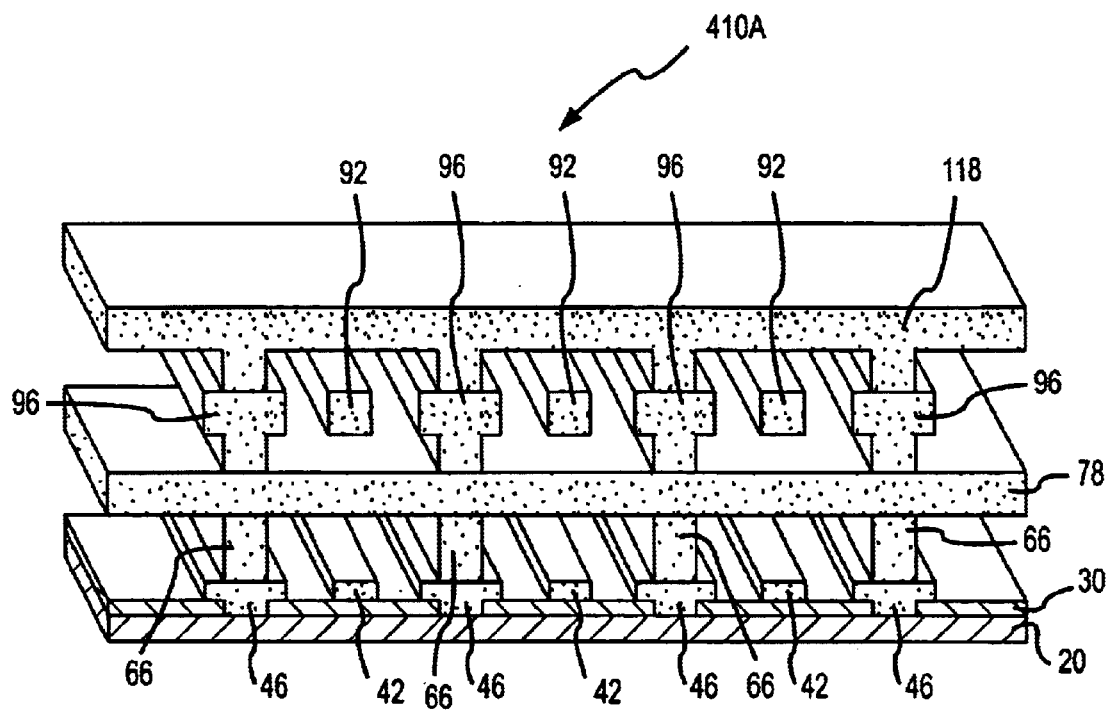
FIGS. 4A–B are perspective cross-sectional and cross-sectional views of a portion of one embodiment of a multi-level shielded multi-conductor interconnect bus in accordance with the present invention.
Figure 4B:
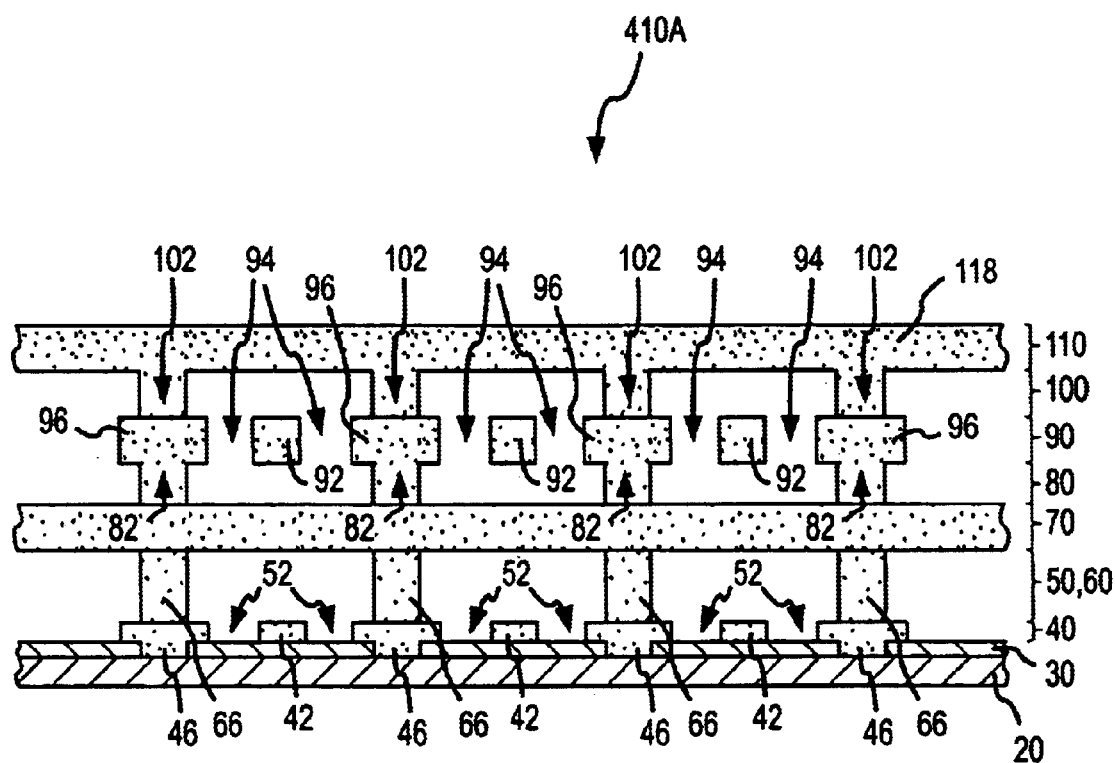

Referring now to FIGS. 4A–D, in addition to grouping conductive lines into sets, the density of conductive lines can also be increased by adding additional layers of conductive lines. FIGS. 4A–B show perspective cross-sectional and cross-sectional views of a portion of one embodiment of a multi-level shielded multi-conductor interconnect bus 410A that has two levels of conductive lines. The multi-level shielded multi-conductor interconnect bus 410A includes a fourth dielectric layer 80 overlying the Poly2 layer 70. The fourth dielectric layer 80 is comprised of an electrically insulating material such as, for example, a sacrificial material (e.g. silicon dioxide or silicate glass). In this regard, the fourth dielectric layer 80 is also referred to herein as the Sacox3 layer 80. Parallel channels 82 are formed in the Sacox3 layer 80. The channels 82 in the Sacox3 layer 80 extend vertically down through the Sacox3 layer to expose the upper surface of the Poly2 layer 70 in one or more locations along the length of the channels 82, and preferably expose the upper surface of the Poly2 layer 70 along the entire length of each channel 82.

A fourth layer of an electrically conductive material (the fourth electrically conductive layer 90) is formed over the Sacox3 layer 80. The electrically conductive material comprising the fourth electrically conductive layer 90 is, for example, doped polysilicon. In this regard, the fourth electrically conductive layer 90 is also referred to herein as the Poly3 layer 90. The Poly3 layer 90 fills in the channels 82 in the Sacox3 layer 80. Poly3 conductive lines 92 and shield walls 96 are provided by removing strips 94 from the Poly3 layer 90 on each side of the channels 82 in the Sacox3 layer 80. A fifth dielectric layer 100 comprised of for example, a sacrificial material (e.g. silicon dioxide or silicate glass), is formed over the Poly3 conductive lines 92 and shield walls 96. The fifth dielectric layer 100 is also referred to herein as the Sacox4 layer 100. Channels 102 aligned over the Poly3 shield walls 96 are formed in the Sacox4 layer 100 to expose the upper surfaces of the Poly3 shield walls 96 along at least portions of, and preferably their entire, length. A fifth electrically conductive layer 110 (also referred to herein as the Poly4 layer 110), comprised of, for example, doped polysilicon is deposited over the Sacox4 layer 100 and into the channels 102 in the Sacox4 layer 100 to provide a horizontal Poly4 shield 118 over the Poly3 conductive lines.

Figure 4C:
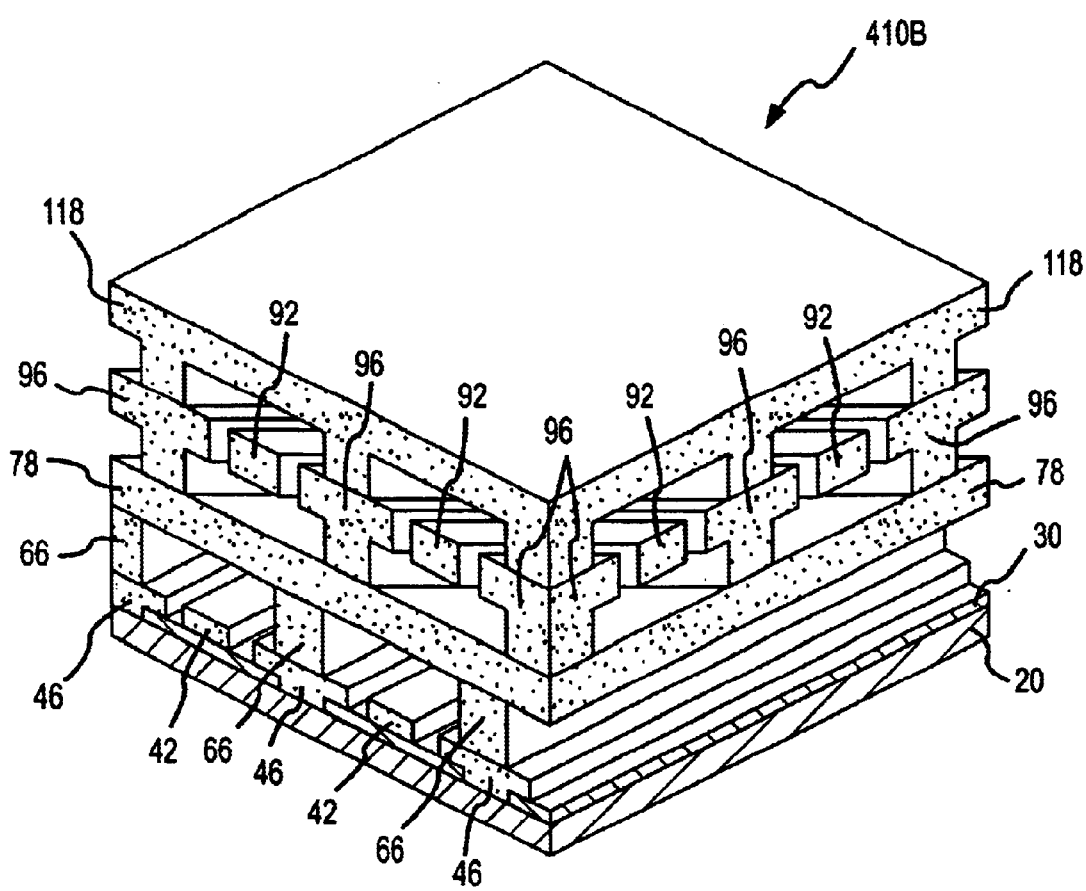
FIGS. 4C–D are perspective cross-sectional and cross-sectional views of a portion of another embodiment of a multi-level shielded multi-conductor interconnect bus in accordance with the present invention.
Figure 4D:
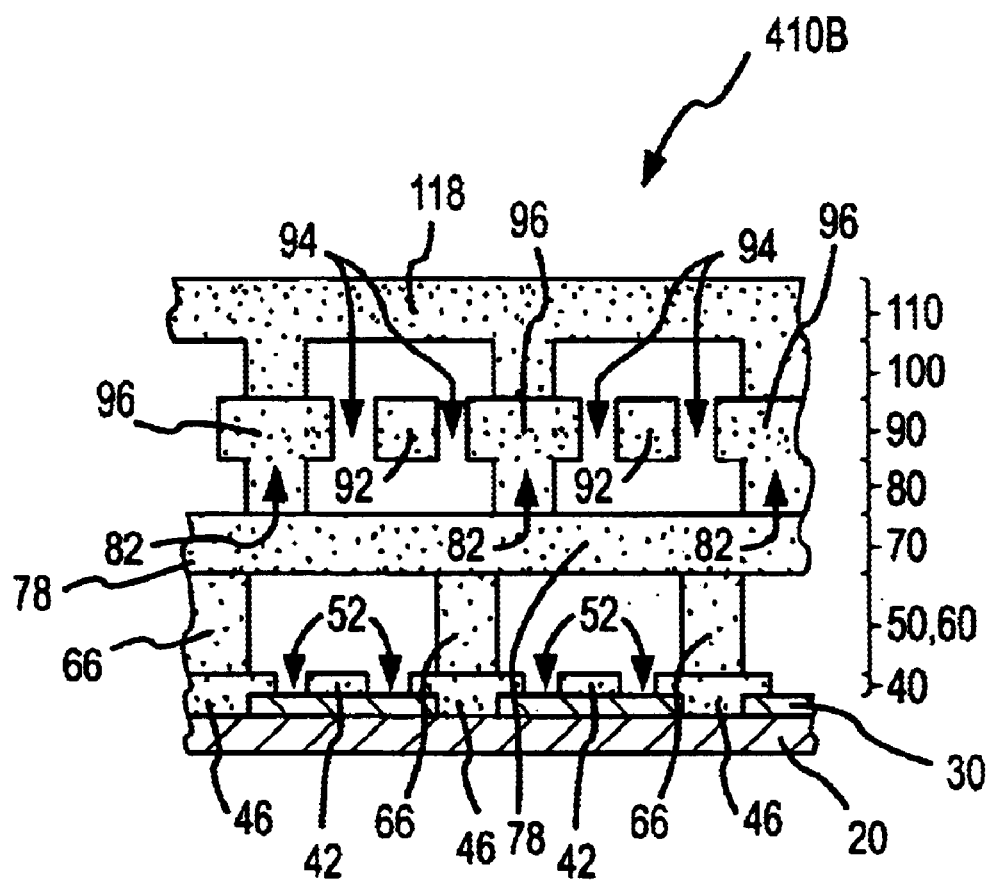

In the multi-level shielded multi-conductor interconnect bus 410A of FIGS. 4A–B, the upper level Poly3 conductive lines 92 and shield walls 96 are oriented in the same direction as the lower level Poly0 conductive lines 42 and shield walls 46. However, it is also possible to orient the upper level Poly3 conductive lines 92 and shield walls 96 transverse to the lower level Poly0 conductive lines 42 and shield walls 46. FIGS. 4C–D show perspective cross-sectional and cross-sectional views of a portion of a second embodiment of a multi-level shielded multi-conductor interconnect bus 410B that has two levels of conductive lines 42, 92, with the upper level conductive lines 92 being oriented transverse to the lower level conductive lines 42.

Although other microfabrication processes may be employed in fabricating multi-level shielded multi-conductor interconnect buses 410A–D as described above, the SUMMiT V™ surface micromachining process developed at Sandia National Laboratories and described, for example, in U.S. Pat. No. 6,082,208, issued Jul. 4, 2000 entitled "Method For Fabricating Five-Level Microelectromechanical Structures And Microelectromechanical Transmission Formed", incorporated by reference herein, is particularly useful for fabricating the multi-level shielded multi-conductor interconnect buses 410A–D. Employing the SUMMiT V™ surface micromachining process to fabricate the multi-level shielded multi-conductor interconnect buses 410A–D permits easy incorporation of the interconnect buses 410A–D into MEM systems fabricated from five polysilicon levels such as some MEM mirror positioning systems useful in optical cross connects and the like.

Figure 5A:
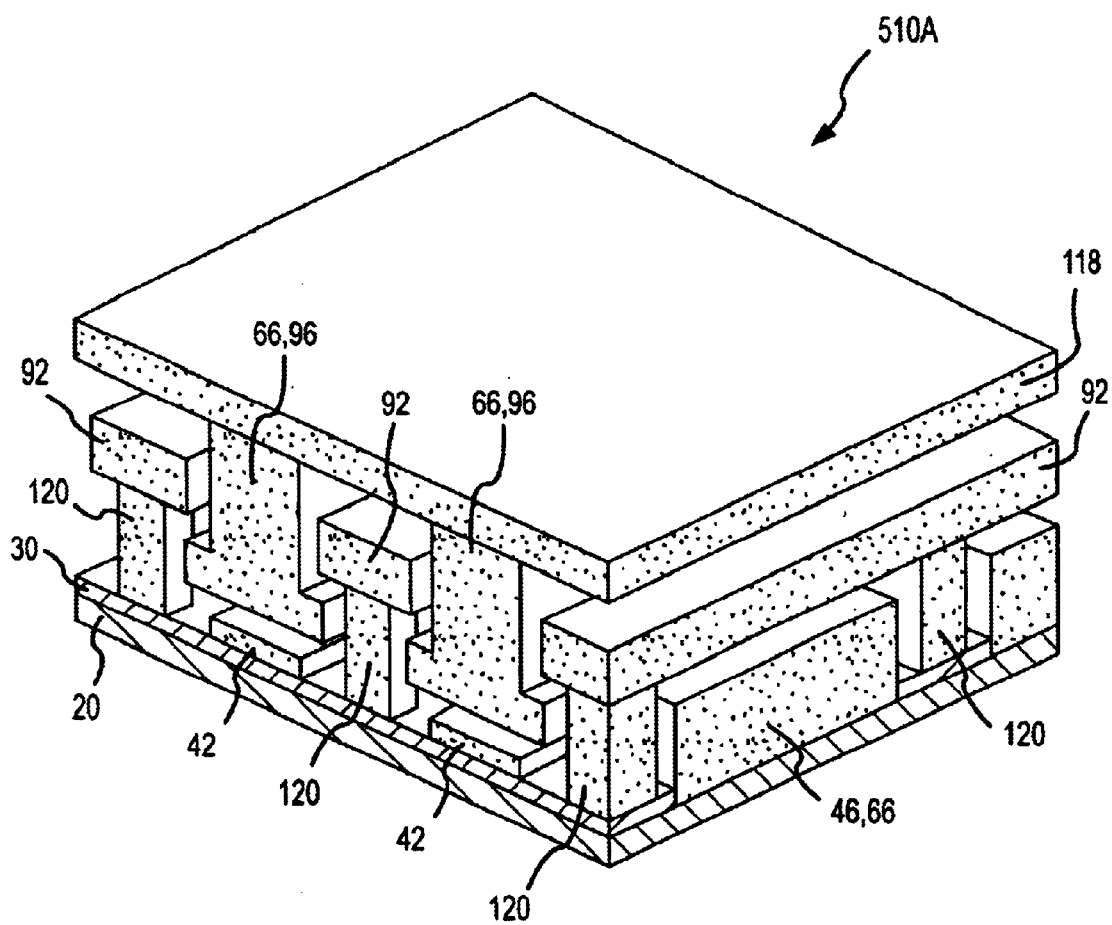
FIG. 5A is a perspective cross-sectional view of a portion of an embodiment of a multi-level shielded multi-conductor interconnect bus in accordance with the present invention having staggered conductive lines supported by anchor posts.
Figure 5B:
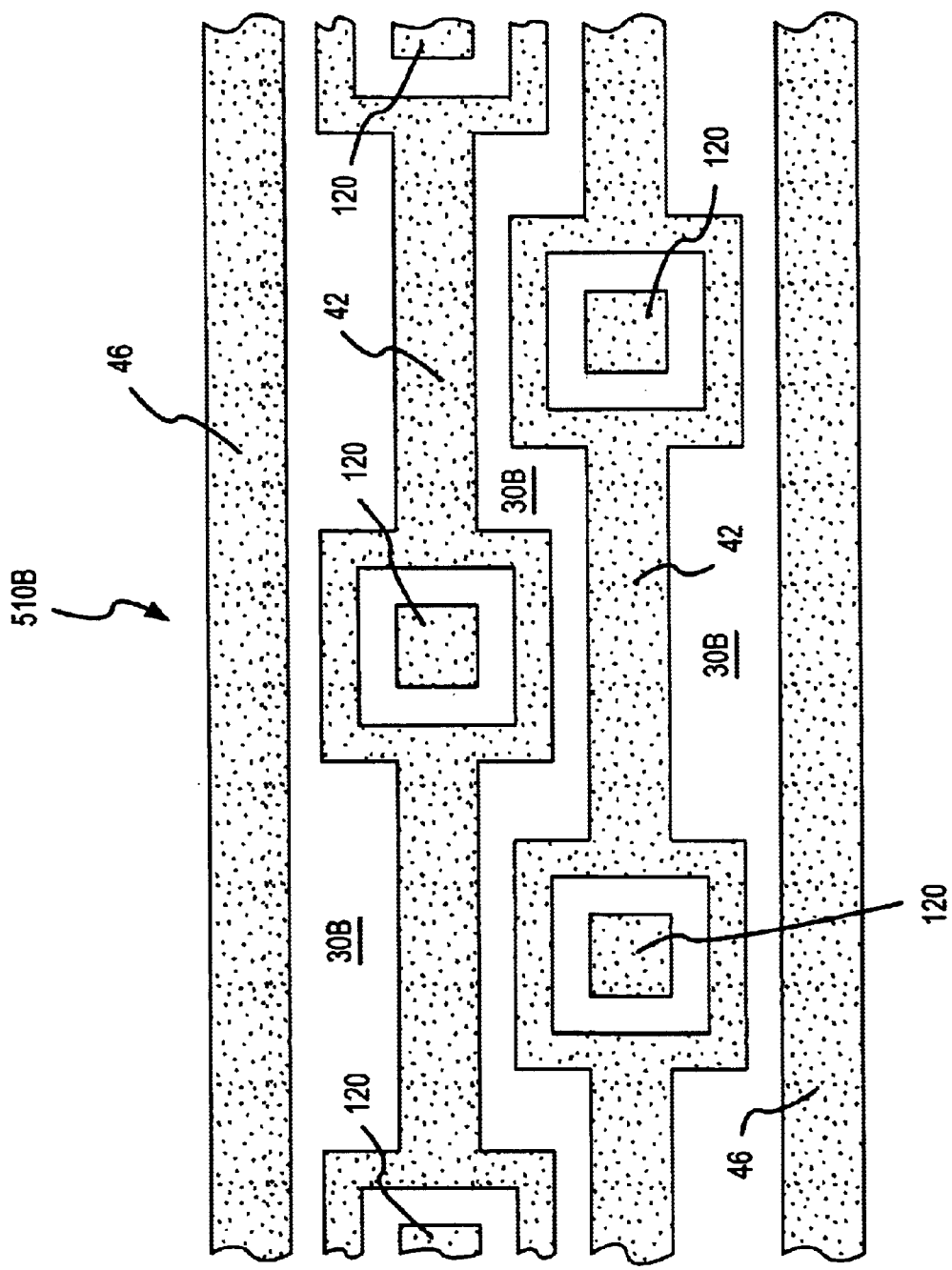
FIGS. 5B–C are top cross-sectional views of portions of two embodiments of a multi-level shielded multi-conductor interconnect bus in accordance with the present invention having non-staggered conductive lines supported by anchor posts.
Figure 5C:
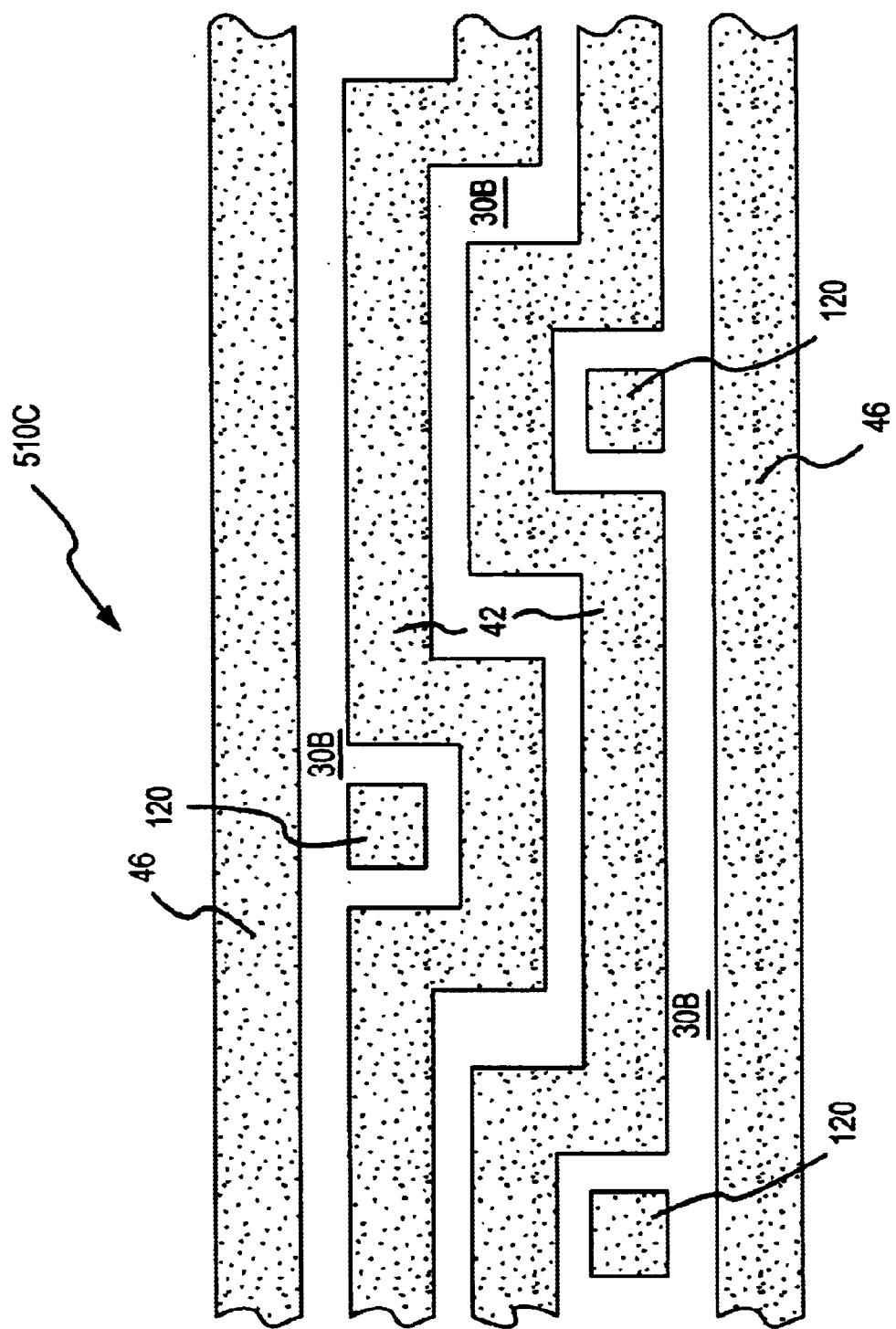

Referring now to FIGS. 5A–C, in the previously described multi-level shielded multi-conductor interconnect buses 410A–D, the Sacox3 and Sacox4 layers 80, 100 remain around the Poly3 conductive lines 92 to support the second level Poly3 conductive lines 92 above the Poly2 layer 70 and prevent electrostatic or capillary attractive forces from pulling the Poly3 conductive lines 92 downward into contact with the Poly2 layer 70, upward into contact with the Poly4 layer 110, or sideways into contact with the Poly3 shield walls 96 on either side thereof. However, it is possible to fabricate multi-level shielded multi-conductor interconnect buses where the Sacox3 and Sacox4 layers 80, 100 are removed (e.g. during subsequent etching steps) from around the Poly3 conductive lines 92, either partially or in their entirety. In this regard, etch release holes (not shown) or the like may be formed in the various polysilicon layers 40, 70, 90, 110 in order to allow for the removal of isolated or encapsulated sacrificial material where desired. The possibility of undesirable contact between the Poly3 conductive lines 92 and either the Poly2 layer 70, the Poly3 shield walls 96, or the Poly4 layer 110 can be alleviated by periodically anchoring the Poly3 conductive lines 92 along their length.

FIG. 5A shows an embodiment of a multi-level shielded multi-conductor interconnect bus 510A wherein anchor posts 120 are periodically spaced along the length of the Poly3 conductive lines 92. The anchor posts 120 extend downward through appropriately sized holes formed in the Poly2 layer 70 (and the Sacox1 layer 50 if it has not also been removed) and rest on top of the first dielectric layer 30 without contacting the lower level Poly0 conductive lines 42. In this regard, the lower level Poly0 conductive lines 42 and upper level Poly3 conductive lines 92 are staggered so that there is adequate space between adjacent Poly0 conductive lines 42 to accommodate the anchor posts 120 therebetween that support each upper level Poly3 conductive line 42. In some fabrication processes (e.g., the SUMMiT V™ process), isolated pads of Poly0 layer 40 material that are slightly larger than the cross-sectional area of the anchor posts 120 will typically be fabricated beneath the anchor posts 120.

As an alternative to staggering the lower level Poly0 conductive lines 42 and upper level Poly3 conductive lines 92, the Poly0 conductive lines 42 can also be configured to have appropriately sized holes formed therethrough that accommodate the anchor posts 120. By way of example, FIG. 5B shows a top cross-sectional view of a multi-level shielded multi-conductor interconnect bus 510B taken at the interface between the Poly0 layer 40 and the Sacox1 layer 50 wherein the Poly0 conductive lines 42 are configured to have donut-like sections in order to provide holes therethrough for the anchor posts 120. The donut-like sections of adjacent Poly0 conductive lines 42 are staggered along the lengthwise extent of the Poly0 conductive lines 42 in order to reduce the lateral width required for the interconnect bus 510B. As may be appreciated, the Poly0 conductive lines 42 may be configured in many other manners as well in order to accommodate the anchor posts 120. For example, FIG. 5C shows a top cross-sectional view of a multi-level shielded multi-conductor interconnect bus 510C taken at the interface between the Poly0 layer 40 and the Sacox1 layer 50 wherein the Poly0 conductive lines 42 are configured to have lateral jogs at various locations along their lengthwise extent in order to accommodate the anchor posts 120.

Figure 6:
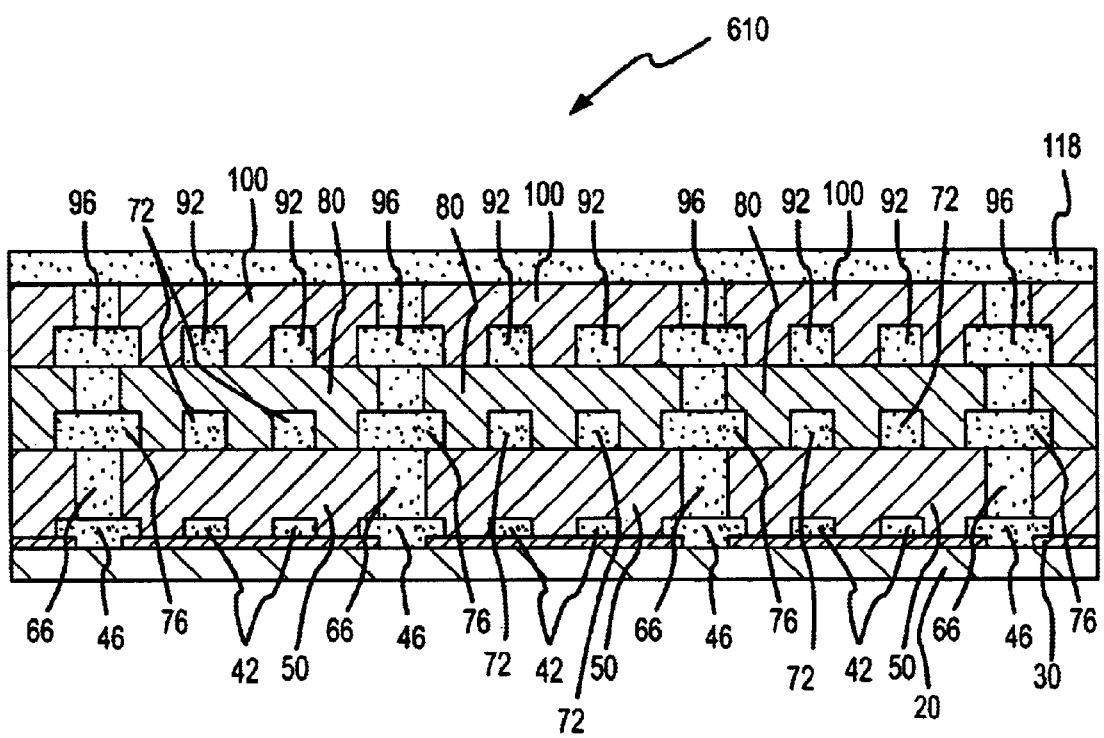
FIG. 6 is a cross-sectional view of an embodiment of a multi-level shielded multi-conductor interconnect bus in accordance with the present invention having three levels of conductive lines.

Referring now to FIG. 6, there may be more than two levels of conductive lines. For example, FIG. 6 shows a multi-level shielded multi-conductor interconnect bus 610 having three levels of conductive lines. The multi-level shielded multi-conductor interconnect bus 610 includes Poly0 conductive lines 42, Poly2 conductive lines 72, and Poly3 conductive lines 92 and a Poly4 shield 118 over the three level Poly0, Poly2, and Poly3 conductive lines 42, 72, 92. The Sacox1, Sacox3 and Sacox4 layers 50, 80, 100 remain around the conductive lines 42, 72, 92 in order to support the conductive lines 42, 72, 92 and prevent undesired movement of the conductive lines 42, 72, 92 due to electrostatic attractive forces. In addition to having three levels of conductive lines 42, 72, 92, the conductive lines 42, 72, 92 may also be grouped at each level into sets between the Poly0, Poly1, Poly2 and Poly3 shield walls 46, 66, 76, 96 (e.g., sets of two conductive lines 42, 72, 92 each as in shown in FIG. 6). As may be appreciated, the number of conductive lines 42, 72, 92 in each set need not be the same across the same level or at different levels.

Boundary Conditions

In the previously described embodiments of a multi-level shielded multi-conductor interconnect bus 410A–D, 510A–C, 610, it is desirable to shift the conductive lines 72, 92 in the upper levels down to the Poly0 level 40 prior to where they reach their endpoints (e.g., where they contact a bond pad at one end and an actuated structure at the other). Shifting the upper level conductive lines 72, 92 down to the Poly0 level may be necessary because where the conductive lines 72, 92 exit their shielding, the Sacox1, Sacox3 and Sacox4 layers 50, 80, 100 supporting the conductive lines 72, 92 may be etched away, and thus unless the upper level conductive lines 72, 92 are supported at their endpoints, the upper level conductive lines 72, 92 will be cantilevered over the substrate 20 near their endpoints and thus inherently weak.

Figure 7:
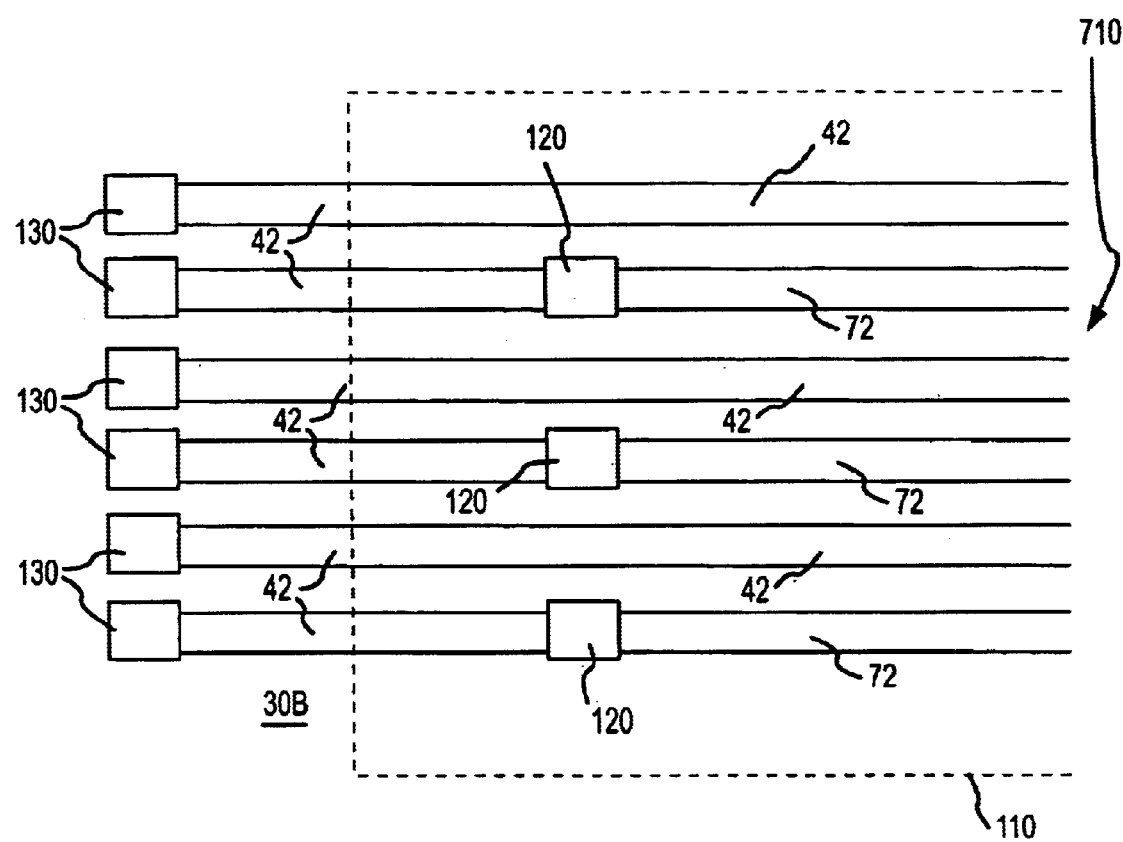
FIG. 7 is a top view of an embodiment of a multi-level shielded multi-conductor interconnect bus in accordance with the present invention where upper level conductive lines shift to the lower level.

One manner of getting the upper level conductive lines 72, 92 down to the Poly0 level is shown in FIG. 7. In FIG. 7, there is shown a top view of a two-level shielded multi-conductor interconnect bus 710 (with the Poly4 shield 118 represented by the dotted line box) having Poly0 conductive lines 42 and Poly3 conductive lines 72, with the Poly0 and Poly3 conductive lines 42, 72 being staggered. The technique illustrated in FIG. 7 can also be applied to shift down Poly4 conductive lines 92 where the conductive lines 42, 72, 92 are appropriately staggered. As is shown in FIG. 7, prior to where the Poly3 conductive lines 72 reach their endpoints, an anchor 120 is formed that extends between the Poly3 conductive line 72 and the level of the Poly0 layer 40 where the conductive line 72 is continued at the Poly0 level to a corresponding bond pad 130 or MEM device. The anchor posts 120 that shift the Poly3 conductive lines 72 down to the Poly0 layer 40 are preferably formed at a sufficient distance back from where the Poly3 conductive lines 72 exit from under the Poly4 shield 118 in order to ensure that enough sacrificial material remains around the Poly3 conductive lines 72 beyond the anchor post 120 to provide adequate support of the Poly3 conductive lines 72. In this regard, it is also possible to have a small cavity between where the anchor posts 120 shift the Poly3 conductive lines 72 down to the Poly0 layer 40 and the end of the sacrificial material. It should be noted that, in addition to solving the problem of having unsupported upper level conductive lines 72 adjacent to their endpoints, shifting the upper level conductive lines 72 down to the Poly0 level has the added advantage of making it simpler to attach the lower and upper level conductive lines 42, 72 of the interconnect bus 710 to an array of devices since the endpoints of all of the conductive lines 42, 72 are at the same level.

While various embodiments of the present invention have been described in detail, further modifications and adaptations of the invention may occur to those skilled in the art. However, it is to be expressly understood that such modifications and adaptations are within the spirit and scope of the present invention.

What is claimed is:

1. A shielded multi-conductor interconnect bus comprising:

a substrate;

a first dielectric layer overlying and supported by at least a portion of said substrate;

a plurality of parallel electrically conductive lines formed on said first dielectric layer, wherein there is no intervening electrically conductive layer between said plurality of parallel electrically conductive lines and said substrate;

a plurality of parallel electrically conductive walls formed on said first dielectric layer, each said electrically conductive wall including an upper section extending vertically above the level of said electrically conductive lines; and an electrically conductive shield formed in a spaced relation above said electrically conductive lines and in contact with said upper sections of said electrically conductive walls;

wherein said electrically conductive lines and said electrically conductive walls are arranged in pattern wherein one of said electrically conductive walls is located between sets of said electrically conductive lines, each said set of electrically conductive lines including at least one of said electrically conductive lines.

2. The interconnect bus of claim 1 wherein said first dielectric layer is formed on an upper surface of said substrate, and wherein said first dielectric layer includes a plurality of parallel channels formed therein, each said channel extending vertically down into said first dielectric layer to expose the upper surface of said substrate along at least a portion of said channel, each said electrically conductive wall including a lower section formed in one of said channels.

3. The interconnect bus of claim 1 further comprising:
a second dielectric layer overlying said electrically conductive lines and said first dielectric layer, said second dielectric layer having a plurality of channels formed therein permitting said upper sections of said electrically conductive walls to extend vertically upward therethrough to contact said electrically conductive shield.

4. The interconnect bus of claim 1 wherein each said set of electrically conductive lines includes two of said electrically conductive lines.

5. The interconnect bus of claim 1 wherein said electrically conductive walls are laterally spaced from each other by no more than 50 microns.

6. The interconnect bus of claim 1 wherein said electrically conductive walls are laterally spaced from each other by no more than 10 microns.

7. The interconnect bus of claim 1 further comprising:
at least one electrically conductive line oriented transversely to said parallel electrically conductive lines and connected to at least one of said parallel electrically conductive lines, said transversely oriented electrically conductive line extending outward from a side of said interconnect bus through a break formed in an outer one of said electrically conductive walls.

8. The interconnect bus of claim 2 wherein said substrate is comprised of silicon and said first dielectric layer comprises a dielectric stack deposited on the upper surface of said substrate, said dielectric stack comprising a lower layer of thermal oxide and an upper layer of silicon nitride.

9. The interconnect bus of claim 3 wherein said second dielectric layer comprises one of silicon dioxide and silicate glass.

10. The interconnect bus of claim 2 wherein said electrically conductive lines and said lower sections of said electrically conductive walls are formed from a first layer of doped polysilicon.

11. The interconnect bus of claim 7 wherein said transversely oriented electrically conductive line is shielded by a pair of electrically conductive walls and an electrically conductive shield supported in a spaced relation above said transversely oriented electrically conductive line.

12. The interconnect bus of claim 7 wherein said transversely oriented electrically conductive line is perpendicular to said parallel electrically conductive lines.

13. The interconnect bus of claim 10 wherein said upper sections of said electrically conductive walls and said electrically conductive shield are formed from a second layer of doped polysilicon.

14. The interconnect bus of claim 11 wherein said electrically conductive walls and electrically conductive shield shielding said transversely oriented electrically conductive line are respectively joined to said outer one of said electrically conductive walls and said shield overlying said parallel electrically conductive lines.

15. The interconnect bus of claim 13 wherein said second layer of doped polysilicon comprises two separately deposited layers of doped polysilicon.

16. A shielded multi-conductor interconnect bus comprising:
a substrate;
a plurality of electrically conductive lines formed on said substrate, each said electrically conductive line being surrounded by dielectric material along a lengthwise extent of each said electrically conductive line, wherein there are no intervening electrically conductive structures formed between each said electrically conductive line and said substrate;
an electrically conductive shield overlying and spaced above said electrically conductive lines; and
a plurality of electrically conductive walls formed on said substrate, each said electrically conductive wall being in contact along a lower section thereof with said substrate and along an upper section thereof with said electrically conductive shield;
said electrically conductive lines and said electrically conductive walls being arranged in pattern wherein one of said electrically conductive walls is located between sets of said electrically conductive lines, each said set of electrically conductive lines including at least one of said electrically conductive lines.

17. The interconnect bus of claim 16 wherein said dielectric material surrounding each said electrically conductive line comprises a lower dielectric stack layer and an upper sacrificial layer.

18. The interconnect bus of claim 16 wherein said electrically conductive lines and said lower sections of said electrically conductive walls are formed from a first layer of doped polysilicon.

19. The interconnect bus of claim 16 wherein each said set of electrically conductive lines includes two of said electrically conductive lines.

20. The interconnect bus of claim 17 wherein said upper sacrificial layer is comprised of one of silicon dioxide and silicate glass.

21. The interconnect bus of claim 17 wherein said substrate is comprised of silicon and said lower dielectric stack layer comprises a lower layer of thermal oxide and an upper layer of silicon nitride.

22. The interconnect bus of claim 18 wherein said upper sections of said electrically conductive walls and said electrically conductive shield are formed from a second layer of doped polysilicon.

23. The interconnect bus of claim 22 wherein said second layer of doped polysilicon comprises lower and upper layers of doped polysilicon.

24. A shielded electrically conductive line comprising:
a substrate;
a first dielectric layer overlying and supported by at least a portion of said substrate;
an electrically conductive line formed on said first dielectric layer, wherein there is no intervening electrically conductive layer between said electrically conductive line and said substrate;
a pair of parallel electrically conductive walls formed on said first dielectric layer, each said electrically conductive wall being located on an opposing side of said electrically conductive line and including an upper section extending above the level of said electrically conductive line; and
an electrically conductive shield formed in a spaced relation above said electrically conductive line and in contact with said upper sections of said electrically conductive walls.

25. The shielded electrically conductive line of claim 24 wherein said first dielectric layer is formed on an upper surface of said substrate, and wherein said first dielectric layer includes a pair of parallel channels formed therein, each said channel extending vertically down into said first dielectric layer to expose the upper surface of said substrate along at least a portion of said channel, each said electrically conductive wall including a lower section formed in one of said channels.

26. The shielded electrically conductive line of claim 24 further comprising:
 a second dielectric layer overlying said electrically conductive line and said first dielectric layer, said second dielectric layer having a pair of channels formed therein permitting said upper sections of said electrically conductive walls to extend vertically upward therethrough to contact said electrically conductive shield.

27. The shielded electrically conductive line of claim 24 wherein said shielded electrically conductive line is connected to at least one electrically conductive line of a shielded interconnect bus.

28. The shielded electrically conductive line of claim 25 wherein said substrate is comprised of silicon and said first dielectric layer comprises a dielectric stack deposited on the upper surface of said substrate, said dielectric stack comprising a lower layer of thermal oxide and an upper layer of silicon nitride.

29. The shielded electrically conductive line of claim 26 wherein said second dielectric layer comprises one of silicon dioxide and silicate glass.

30. The shielded electrically conductive line of claim 25 wherein said electrically conductive line and said lower sections of said electrically conductive walls are formed from a first layer of doped polysilicon.

31. The shielded electrically conductive line of claim 30 wherein said upper sections of said electrically conductive walls and said electrically conductive shield are formed from a second layer of doped polysilicon.

32. The shielded electrically conductive line of claim 24 wherein said second layer of doped polysilicon comprises two separately deposited layers of doped polysilicon.

33. A shielded multi-conductor interconnect bus comprising:
 a substrate;
 a first dielectric layer overlying and supported by at least a portion of said substrate;
 a plurality of parallel electrically conductive lines formed on said first dielectric layer;
 a plurality of parallel electrically conductive walls formed on said first dielectric layer, each said electrically conductive wall including an upper section extending vertically above the level of said electrically conductive lines, wherein said parallel electrically conductive lines and said parallel electrically conductive walls are arranged in pattern wherein one of said parallel electrically conductive walls is located between sets of said parallel electrically conductive lines, each said set of parallel electrically conductive lines including at least one of said parallel electrically conductive lines;
 an electrically conductive shield formed in a spaced relation above said electrically conductive lines and in contact with said upper sections of said electrically conductive walls; and
 at least one electrically conductive line oriented transversely to said parallel electrically conductive lines and connected to at least one of said parallel electrically conductive lines, said transversely oriented electrically conductive line extending outward from a side of said interconnect bus through a break formed in an outer one of said electrically conductive walls.

34. The interconnect bus of claim 33 wherein said transversely oriented electrically conductive line is shielded by a pair of electrically conductive walls and an electrically conductive shield supported in a spaced relation above said transversely oriented electrically conductive line.

35. The interconnect bus of claim 33 wherein said transversely oriented electrically conductive line is perpendicular to said parallel electrically conductive lines.

36. The interconnect bus of claim 34 wherein said electrically conductive walls and electrically conductive shield shielding said transversely oriented electrically conductive line are respectively joined to said outer one of said electrically conductive walls and said shield overlying said parallel electrically conductive lines.

* * * * *